(12) United States Patent
Ksendzov

(10) Patent No.: US 6,856,641 B2
(45) Date of Patent: Feb. 15, 2005

(54) RING RESONATOR BASED NARROW-LINEWIDTH SEMICONDUCTOR LASERS

(75) Inventor: Alexander Ksendzov, La Crescenta, CA (US)

(73) Assignee: California Institute of Technology, Pasadena, CA (US)

(*) Notice: Subject to any disclaimer, the term of this patent is extended or adjusted under 35 U.S.C. 154(b) by 0 days.

(21) Appl. No.: 10/057,427

(22) Filed: Jan. 25, 2002

(65) Prior Publication Data

US 2002/0105998 A1 Aug. 8, 2002

Related U.S. Application Data

(60) Provisional application No. 60/264,556, filed on Jan. 26, 2001.

(51) Int. Cl.[7] ................................................. H01S 3/08
(52) U.S. Cl. ......................... 372/108; 372/92; 372/94; 372/96; 372/98; 372/102
(58) Field of Search ............................... 372/92, 94, 96, 372/98, 102, 108; 385/10

(56) References Cited

U.S. PATENT DOCUMENTS

| | | | | |
|---|---|---|---|---|
| 4,911,513 A | * | 3/1990 | Valette | ..................... 350/96.12 |
| 5,004,342 A | * | 4/1991 | Bernard et al. | ............. 356/461 |
| 5,647,038 A | * | 7/1997 | Minden et al. | ................ 385/37 |
| 5,917,973 A | * | 6/1999 | Iwasaki | ........................ 385/45 |
| 6,009,115 A | * | 12/1999 | Ho | ................................ 372/92 |
| 6,243,517 B1 | * | 6/2001 | Deacon | ........................ 385/50 |
| 6,272,165 B1 | * | 8/2001 | Stepanov et al. | ............. 372/94 |
| 6,501,885 B2 | * | 12/2002 | Holzner et al. | ................ 385/39 |
| 6,522,795 B1 | * | 2/2003 | Jordan et al. | ................. 385/10 |
| 2002/0076149 A1 | * | 6/2002 | Deacon | ........................ 385/27 |
| 2002/0094150 A1 | * | 7/2002 | Lim et al. | ...................... 385/15 |
| 2003/0219045 A1 | * | 11/2003 | Orenstein et al. | ............. 372/20 |
| 2004/0022474 A1 | * | 2/2004 | Lim et al. | ....................... 385/4 |
| 2004/0125833 A1 | * | 7/2004 | Sarlet et al. | .................. 372/20 |
| 2004/0136412 A1 | * | 7/2004 | Jones | .......................... 372/20 |

\* cited by examiner

*Primary Examiner*—Don Wong
*Assistant Examiner*—Leith Al-Nazer
(74) *Attorney, Agent, or Firm*—J. D. Harriman, II; Coudert Brothers LLP

(57) ABSTRACT

The present invention is a method and apparatus for using ring resonators to produce narrow linewidth hybrid semiconductor lasers. According to one embodiment of the present invention, the narrow linewidths are produced by combining the semiconductor gain chip with a narrow pass band external feedback element. The semi conductor laser is produced using a ring resonator which, combined with a Bragg grating, acts as the external feedback element. According to another embodiment of the present invention, the proposed integrated optics ring resonator is based on plasma enhanced chemical vapor deposition (PECVD) $SiO_2/SiON/SiO_2$ waveguide technology.

14 Claims, 8 Drawing Sheets

· · · · · · · · = Chirp Reduction Factor

――――― = Resonator Reflectivity

RING RESONATOR BASED NARROW-LINEWIDTH SEMICONDUCTOR LASERS

RELATED APPLICATION

This application claims the benefit of United States Provisional Patent Application No. 60/264,556, filed on Jan. 26, 2001, and the benefit of United States Non-Provisional Patent Application No. 09/964,198, filed on Sep. 25, 2001, the disclosures of which are hereby incorporated by reference.

The invention described herein has certain rights by the U.S. Government pursuant to Grant No. DAAH04-94-G-0274 and F29601-00-K-0184 awarded by DARPA and NASA Contract No. NAS7-1407.

BACKGROUND OF THE INVENTION

1. Field of the Invention

The present invention relates to the field of lasers, and in particular to ring resonator based narrow linewidth semiconductor lasers.

Portions of the disclosure of this patent document contain material that; is subject to copyright protection. The copyright owner has no objection to the facsimile reproduction by anyone of the patent document or the patent disclosure as it appears in the Patent and Trademark Office file or records, but otherwise reserves all rights whatsoever.

2. Background Art

Light amplification by stimulated emission of radiation, or laser, is making roadways in many facets of our daily lives. For example, lasers can be used in alignment applications (to guide machines for drilling tunnels and for laying pipelines), defining targets for military purposes, interferometers (to measure large distances with precision), photography (to simulate a third dimensional depth in holography), medical procedures (to perform surgery on the retina of an eye), communications, and space applications using interferometric metrology and atmospheric spectroscopy, especially in the far infrared 2–3 THz range which requires a very narrow linewidth hybrid semiconductor laser. Even though lasers with very narrow linewidth (10 kHz) are commercially available, they are not tunable over a large range. In order to better understand this limitation of prior art lasers, a thorough understanding of lasers and its various applications are discussed next.

Laser

A laser is any class of devices that produces an intense beam of light of a very pure single color. In principle, atoms and molecules exist at low and high energy levels. Those at low levels can be excited to higher levels, for example by heat, and after reaching the higher levels they give off light when they return to a lower level. In ordinary light sources the many excited atoms and molecules emit light independently and in many different colors (wavelengths). If, however, during the brief instant that an atom is excited, light of a certain wavelength impinges on it, the atom can be stimulated to emit radiation that is in phase (in step) with the wave that simulated it. The new emission thus augments the passing wave; if the phenomenon can be multiplied sufficiently, the resulting beam or laser made up of wholly coherent light, is very intense.

Prior Art Lasers

Depending upon the technique used to create lasers, prior art lasers have a vast range of applications, but they all have limitations and drawbacks that make prior art lasers unsuitable for interferometric metrology, space exploration applications, fiber optics communications, and long distance communications, to name a few.

Liquid lasers made, for example, from a solution of neodymium oxide or chloride in selenium oxychloride, and dye lasers made, for example, from rhodamine 6G and methylumbelliferone mixed with hydrochloric acid suffer from the lack of very fine tuning of the laser beam, especially over large distances needed, for example, in space exploration. Even though the dye lasers can be tuned over a wide spectral range, they are very flimsy and can be only used under laboratory conditions.

Other lasers, namely the gas discharge lasers which have applications in neon signage, gas dynamic lasers, and chemical lasers not only suffer from the lack of fine tuning of the laser beam, especially over large distances needed, for example, in space exploration, or in situations where a high intensity fine tuned laser beams are needed, but are too bulky and not rugged enough that they have to be handled gently under laboratory conditions. Since the equipment needed to generate these lasers is bulky and occupies a lot of space, it could be critical for certain applications where space and weight conservation are the primary goals.

Optically-pumped solid-state lasers that have applications in metallurgy where the precise cutting of very hard materials is needed, and in mining of minerals have the disadvantage of frequent breakdown and damage at higher power levels because of the intense heat generated within the laser material and by the pumping lamp. This handicap eliminates this kind of laser from applications which are subject to intense temperature variations. The optically-pumped solid-state lasers also suffer from the drawback of a very narrow tuning range of less than 50 GHz.

Free-electron lasers are more efficient than any of the previously mentioned variety in producing laser beams of very high power radiation. Furthermore, these devices are tunable, so that they can be made to operate at microwave to ultraviolet wavelengths. But since the laser beam is generated using free electrons from a particle accelerator or some similar source and passed through an undulator (a device consisting of a linear array of electromagnets), it makes the entire device very bulky and heavy to transport, for example in a module used for spare exploration. Furthermore, the entire device has to be kept stationary so that the electromagnets are not influenced by any external forces. These limitations narrow the range of commercial applications for this kind of laser.

Semiconductor lasers are another kind of lasers. Semiconductor lasers consist of a flat junction of two pieces of semiconductor material, each of which are treated with a different type of impurity. When a large electrical current is passed through such a device, laser light emerges from the junction region. This kind of laser suffers from low power output, but the low cost and small size makes these devices suitable for use as light sources, even though it's in a limited commercial market comprising of optical fiber communication and compact digital audio disc players.

R. Kazarinov, C. Henry, and N. Olsson in their paper titled "Narrow-Band Resonant Optical Reflectors and Resonant Optical Transformers for Laser Stabilization and Wavelength Narrow-Division Multiplexing" published in the IEEE Journal of Quantum Electronics (1987), QE-23, on pages 1419 through 1425, and incorporated herein as reference, have proposed a new way of making resonant integrated optical circuits, which are based on a weak side-by-side coupling between waveguides (pipelines for the transmittal of the laser light) and high Q distributed Bragg resonators. Using their proposed mathematical calculations, it is possible to create a narrow linewidth hybrid (the coupling of active internal elements that make laser light and passive external elements, for example a Bragg grating written on a waveguide) semiconductor laser. But units made using the narrow-band resonant optical reflector technology proposed by R. Kazarinov, C. Henry, and N. Olsson are not rugged enough for use as communications hardware or in space applications.

Other prior art schemes of making lasers include external elements using silicon and doped silicon dioxide light guides or waveguides with Bragg gratings. Waveguides made with these materials have much larger modes (Modes are specific patterns that the laser light follows. Each waveguide has the ability to propagate a well defined pattern called its waveguide mode) than the standard gain chips (which are the active internal elements that produce the laser light). This necessitates the use of gain chips with mode converters (which are elements that tune the mode of the waveguide so that there is minimal loss of light at the interface of the waveguide and the laser due to mismatch of their respective modes), which are not only expensive, but not readily available.

Other lasers, namely the narrow linewidth semiconductor lasers utilizing integrated optical external feedback elements have been demonstrated by Ackerman et. al. in their paper "Compact hybrid resonant optical reflector lasers with very narrow linewidths", Appl. Phys. Lett. 58 (5) on pages 449 through 450 (1991), and by Korotky et. al. in their paper "Integrated-optic, narrow-linewidth laser", Appl. Phys. Lett. 49 (1) on pages 10 through 11 (1986), and incorporated herein as references. Both these references use a resonant optical reflector (ROR) as a means of the linewidth narrowing. The RORs produced by the first. reference prove difficult in fabrication due to low tolerance in the relative positioning of the two gratings comprising the resonator. The second reference implements RORs requiring a complicated electro-optic phase control. Both these reference are hence unsuitable for applications such as interferometric metrology, spectroscopy, or coherent optical communications.

SUMMARY OF THE INVENTION

The present invention is a method and apparatus for using ring resonators to produce narrow linewidth hybrid semiconductor lasers. According to one embodiment of the present invention, the narrow linewidths are produced by combining a semiconductor gain chip with a narrow pass band external feedback element. The semi conductor laser is produced using a ring resonator which, when combined with a Bragg grating acts as the external feedback element. According to another embodiment of the present invention, the proposed integrated optics ring resonator is based on plasma enhanced chemical vapor deposition (PECVD) silicon-oxide/silicon-oxynitride/silicon-oxide ($SiO_2$/SiON/$SiO_2$) waveguide technology.

BRIEF DESCRIPTION OF THE DRAWINGS

These and other features, aspects and advantages of the present invention will become better understood with regard to the following description, appended claims and accompanying drawings where:

DETAILED DESCRIPTION OF THE INVENTION

The present invention is a method and apparatus for creating a narrow linewidth hybrid semiconductor laser using a ring resonator. In the following description, numerous specific details are set forth to provide a more thorough description of embodiments of the invention. It will be apparent, however, to one skilled in the art, that the invention may be practiced without these specific details. In other instances, well known features have not been described in detail so as not to obscure the invention.

The present invention utilizes silicon-oxide and silicon-oxynitride ($SiO_2$—SiON) based passive external feedback elements that are coupled with the active internal elements to create the narrow linewidth hybrid laser. According to one embodiment of the present invention, these external feedback elements are made to closely match the modes of a standard gain chip. At the same time, using the hybridization technique explained below, the present system enables the fabrication of rugged, reliable lasers for large range and space expanses, for example, deep sea or outer space exploration, and communications. Since these external feedback elements do not need gain chips with mode converters that are expensive and not readily available, the present invention cuts on cost and the time to make a rugged, narrow linewidth laser.

Figure 1:
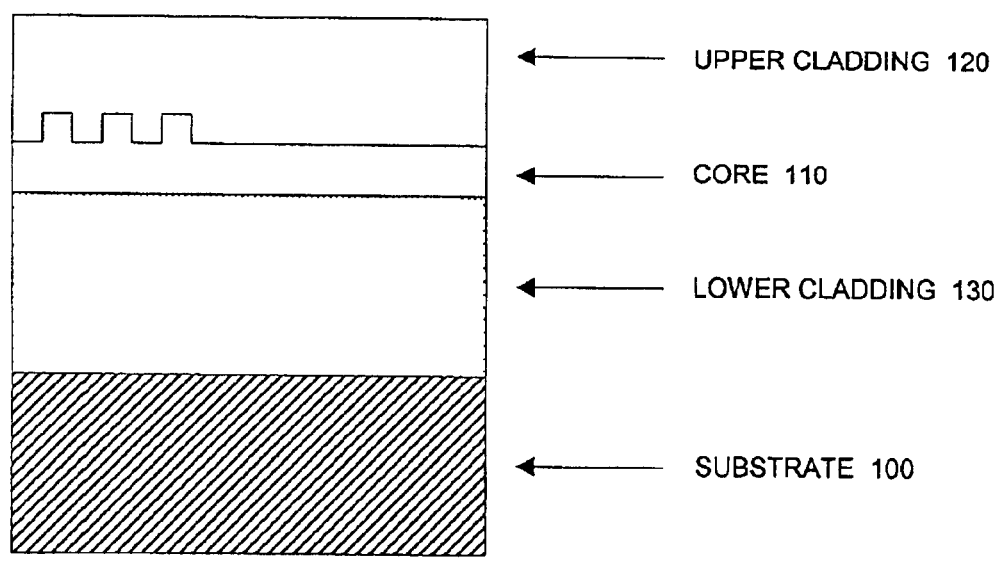
FIG. 1 is an illustration of a periodic variation of the refractive index in the core region or cladding of two Bragg gratings.

According to another embodiment of the present invention, the external feedback elements use Bragg gratings with a resonate optical reflector, which are formed by the coupling and the periodic variation of the refractive index in the core region or cladding of two Bragg gratings. This is depicted in FIG. 1, where substrate 100 is the bottommost layer followed by lower cladding layer 130. Core 110 is sandwiched between upper cladding 120 and lower cladding 130. The spatial period of the modulation is related to the desired center wavelength through an effective mode index.

For example, at 1.5 $\mu$m a grating pitch of approximately 0.53 $\mu$m is calculated. According to another embodiment of the present invention, in order to produce patterns with such small dimensions, a direct-write electron beam (or e-beam) lithography is used to etch the pattern directly onto the waveguide. In experiments performed using the present invention, a 700-fold linewidth reduction relative to a similar Fabri-Perot laser can be achieved with Bragg gratings. Further reduction in the linewidth can be achieved by using additional resonating structures, one of which is explained below.

Resonant Optical Reflector

Figure 2:
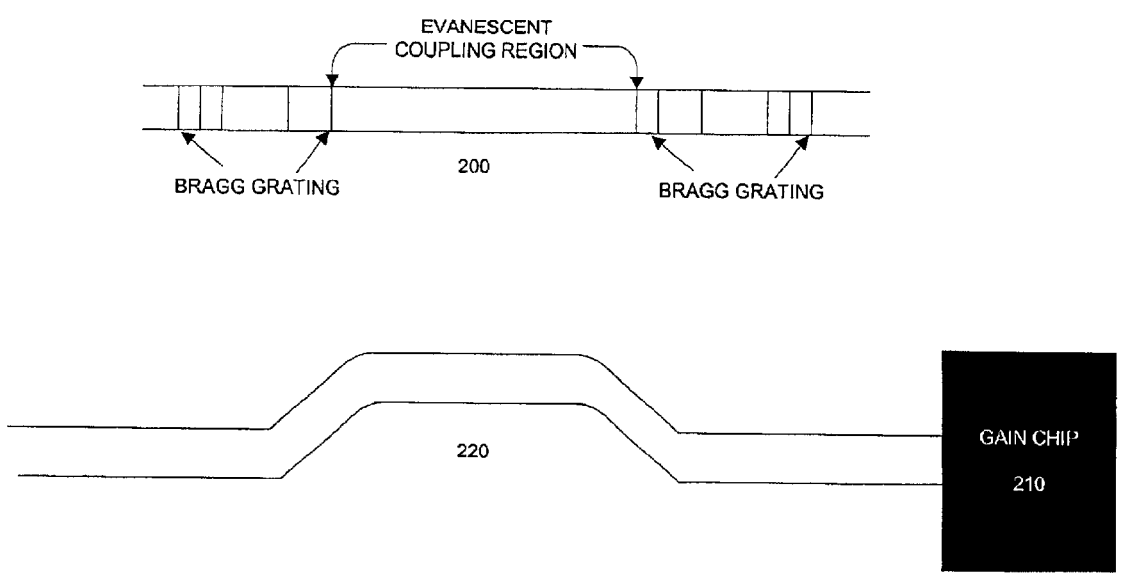
FIG. 2 is an illustration of a resonant optical reflector.

The resonant optical reflector seen in FIG. 2 is a graphical or schematic representation of a resonating structure used to achieve further narrowing of the linewidth, according to another embodiment of the present invention. The resonator formed by the straight waveguide section 200 bounded by two Bragg gratings, which aid in creating the resonator, has a sharp transmittance peak that is converted into a reflectance resonance via a weak coupling of gain chip 210 to a main curved waveguide trunk 220.

In operation the light from gain chip 210 is made to flow through the curved waveguide trunk 220. Since the straight waveguide 200 is in such close proximity to the curved waveguide trunk 220, the laser light is coupled onto the straight waveguide, and is depicted by the region marked "evanescent coupling region". The laser experiences a sharp reflectance peak coinciding with the peak of the resonator, and a narrow linewidth laser is achieved.

Using mathematical calculations developed by R. Kazarinov, C. Henry, and N. A. Olsson (see their paper mentioned in the Background Section), laboratory experiments using the resonant optical reflector external feedback of FIG. 2 resulted in a linewidth reduction of up to 5000 given a waveguide loss of 0.5 dB/cm, mode mismatch loss of 1 dB and interface reflectivity of 3% (0.13 dB).

The present laser posses a narrow linewidth (tens of kHz) that can be accurately tuned. This property of the present invention is crucial to facilitate locking to an ultra-stable cavity for further linewidth reduction. Locking is accomplished by an electronic feedback loop that tunes the laser in response to the wavelength fluctuations away from the cavity resonance. The bandwidth of the feedback loop must be approximately equal to the laser linewidth to properly compensate for the frequency fluctuations. Unlike prior art semiconductor lasers with linewidths above the 100 kHz range that cannot be properly handled by the feedback loop mentioned above since their response to fast (above the 100 kHz range) and slow (below the 100 kHz range) tuning has opposite signs, the present invention does not encounter the same limitations.

According to one embodiment of the present invention, the hybridization technology can achieve the narrow linewidth in miniature micromachined units as well as non-miniature units. This makes the present invention not only conservative in size, but also in weight, which makes it ideal for applications where space and weight are of prime importance, for example in space or deep sea explorations.

Figure 3:
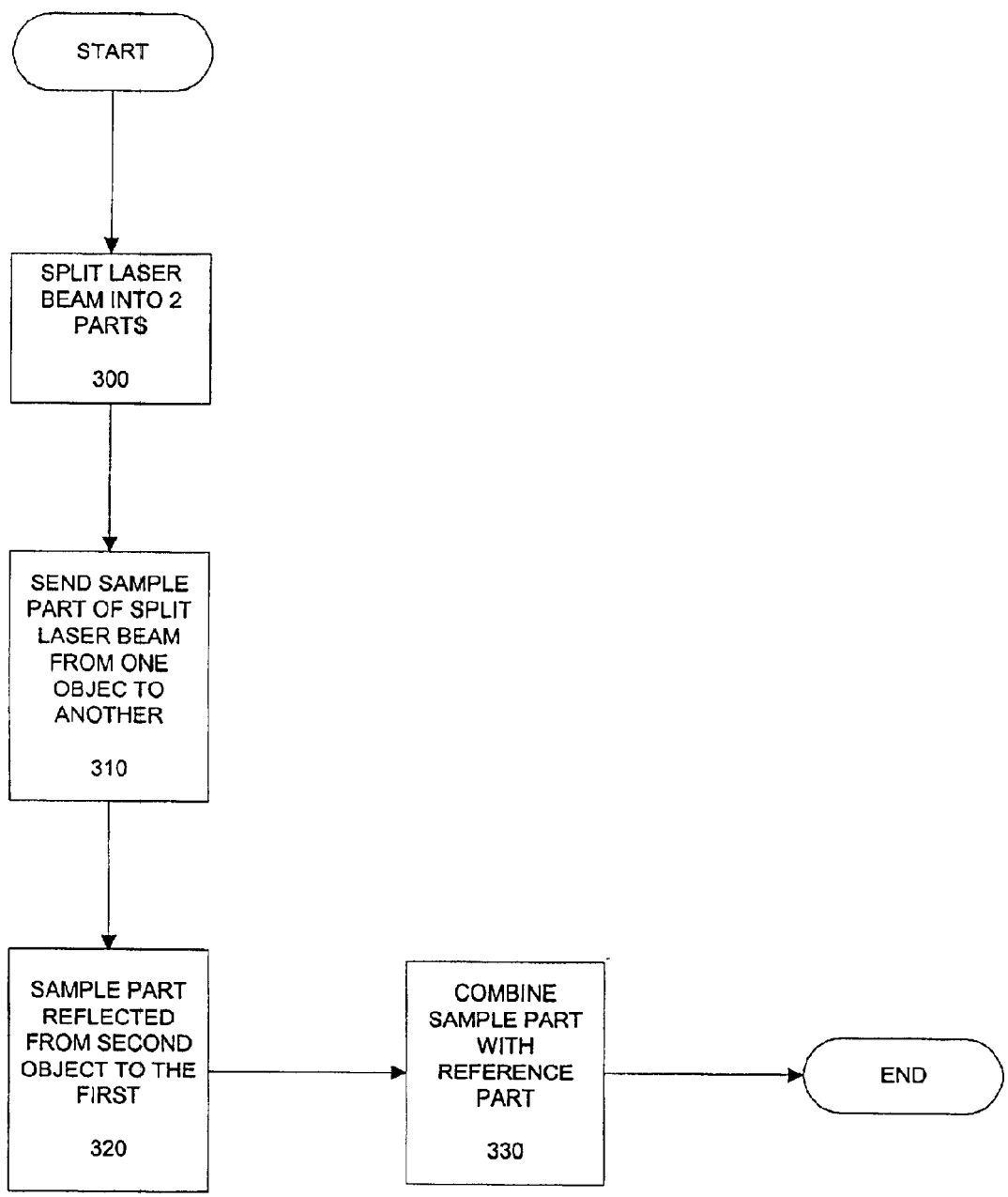
FIG. 3 is a flowchart illustrating an application of the present invention.

One use of narrow linewidths of the present invention is seen in interferometric metrology. In order to precisely determine the distance between two objects in space, for example two spacecraft, a laser beam, originating from the first object is split in two parts, viz. a reference and a sample part. The sample part of the laser beam is sent from the first object to the second object. This sample part of the laser beam is reflected back to the first object, where it is combined with the reference part. This exercise is illustrated in FIG. 3, where at box 300 a laser beam is split into 2 parts, viz. the reference and sample part. At box 310, the sample part is sent from one object to another. At box 320, the sample part is reflected back from the second object towards the first. At box 330, the return sample part of the laser beam is combined with the reference part.

The intensity of the combined beam depends upon the distance between the two objects and the wavelength of the laser beam. If the distance changes, the maxima and minima will succeed each other as the shift of half wavelengths occurs. In other words, the interference fringes with a period of half wavelength are observed. The distance can therefore be determined by measuring the intensity of the combined beams in relationship to the above mentioned maxima and minima. The present invention can precisely measure the distance between two objects because of two key factors, viz. spectral purity and stability of the laser light source.

Another use of narrow linewidths of the present invention is seen in the generation of terahertz radiation needed for spectroscopic measurements of the upper atmosphere and interstellar gases. Characteristics of a specific gas are measured by using the spectrally narrow absorption peaks seen in the terahertz region of the gas spectra. The measurement requires the fine tuning of a narrow linewidth terahertz source around a specific frequency.

One method used to generate this terahertz radiation is adopted by the present invention where two laser beams are combined on a piece of semiconductor which acts as a mixer. The combine (or beat) frequency, which is the difference between the frequencies of the two laser beams, is generated on the mixer. For this technique to work, not only are two narrow linewidth lasers needed with their radiation frequencies differing by the specific frequency required for the measurement, but a wide tunability is needed for the spectral coverage. Both these requirements are successfully met by the present invention. A narrow linewidth of the two lasers is essential as the combined terahertz source is only as good as the lasers being used for the radiation generation. Even though prior art single narrow linewidth lasers are available which can be used to generate terahertz radiation, pairs of narrow linewidth lasers separated by the necessary frequency interval are not available, and the present invention fills this gap.

Hybridization Process

According to another embodiment of the present invention, the laser is precisely attached to the waveguide by the use of a flip-chip aligner-bonder, which is essentially a microprocessor controlled visible optics system that permits precise alignment and bonding of a flipped die to a substrate. This may be accomplished, for example, by inserting a dual sensor optical probe between the dye and substrate to provide visual images of both the dye and the substrate. Video images from an autocollimator illuminator are superimposed on a video screen permitting visual alignment using, for example, a motorized six axis pitch and roll or a floating/vacuum hold mechanism to position the samples in parallel orientation.

Once the images have been aligned to coincide, the optical probe is withdrawn and the dye and the substrate, now parallel to each other and properly aligned, are brought into contact and bonding is initiated. Preprogrammed pressure and temperature profiles may be followed to ensure proper bonding for the type of contact pads being bonded.

According to one embodiment of the present invention, the flip-chip aligner-bonder uses a technique described by K. A. Cooper, et. al in their paper titled "Flip Chip Equipment For High End Electro-Optical Modules" published in the IEEE Proc. Of ECTC, Seattle, Wash., in May 1998 on page 176, and incorporated herein as reference. Using this technique, the mechanical alignment and placement burdens are borne by a robotic placement machine. Differing substantially from pick and place machines available on the market today, the flip-chip bonder using the technique proposed by K. A. Cooper, et. al. is specifically aimed at the special requirements of the optoelectronic module market, giving special attention to thermal and optical requirements.

The technique described by K. A. Cooper, et. al. accurately assembles high-end optoelectronic modules using a laser diode aligned to a single mode fiber or an optical waveguide, which is soldered to a substrate. The post-bonding alignments of this technique is better than 1 $\mu$m for optimum device performance.

According to one or more embodiments of the present invention, a semiconductor optical gain chip is soldered to a micromachined silicon bench. The gain chip and waveguide modes of the present invention are not only tailored to match each other, but precisely aligned. The vertical and horizontal alignments are achieved through the use of micromachined stand-offs and during the soldering operation through the use of a flip-chip aligner-bonder, respectively.

Figure 4:
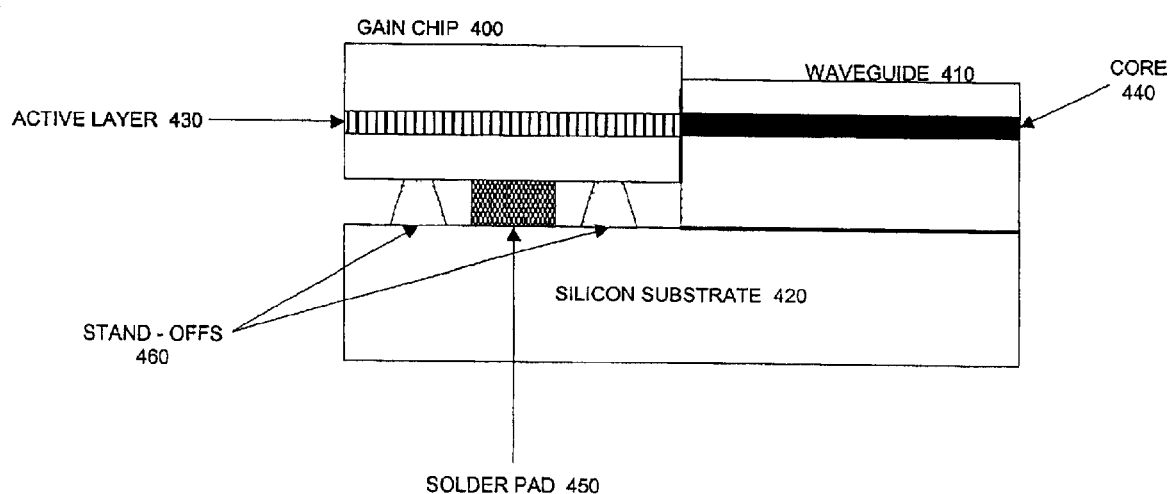
FIG. 4 illustrates a hybridization technique that facilitates precise alignment of a gain chip to a waveguide.

FIG. 4 illustrates a hybridization technique that facilitates precise alignment of the gain chip to the waveguide. Gain chip 400 is coupled with waveguide 410. Both of these are precisely aligned on top of a silicon substrate 420. The alignment is deemed precise once active layer 430 of gain chip 400 is perfectly in line with core 440 of waveguide 410. While the waveguide is aligned directly on top of silicon substrate 420, the gain chip is separated from the silicon substrate by solder pad 450 and stand-offs 460.

In order to achieve a 1 dB coupling loss to a typical gain chip, laboratory tests indicate that using the above mentioned hybridization technique the vertical and horizontal alignment tolerances have to be within ±0.2 $\mu$m and ±1.5 $\mu$m respectively. The vertical alignment may be achieved through the use of micromachined stand-offs (element 460 in FIG. 4), while the horizontal alignment may be achieved during the soldering operation through the use of a flip-chip aligner-bonder.

Resonator Construction

Figure 5:
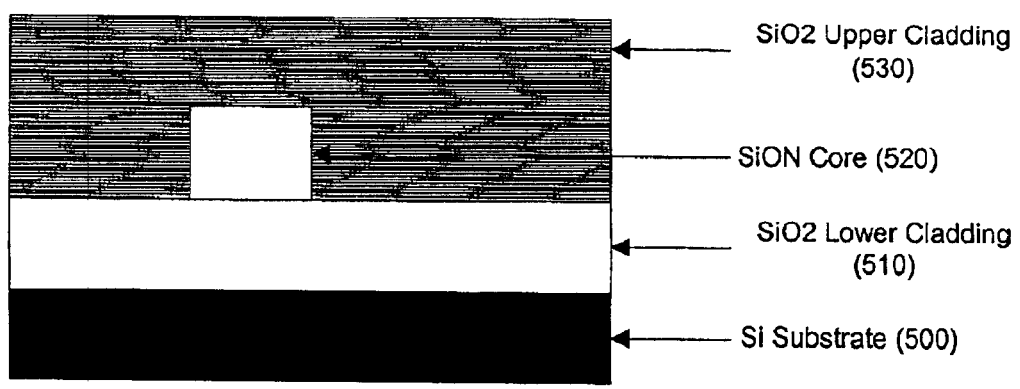
FIG. 5 is an illustration of a waveguide layout using $SiO_2$/SiON/$SiO_2$ waveguide technology according to one embodiment of the present invention.

The present invention utilizes a ring resonator based on plasma enhanced chemical vapor deposition (PECVD) silicon-oxide/silicon-oxynitride/silicon-oxide ($SiO_2$/SiON/$SiO_2$) waveguide technology. FIG. 5 illustrates the waveguide cross section, where 500 is the silicon substrate on which the waveguide is placed. In FIG. 5, 510 is the $SiO_2$ lower cladding of the waveguide, and 530 is the SiO2 upper cladding of the waveguide. SiON core 520 is sandwiched between the upper and lower claddings of the waveguide.

Figure 6:
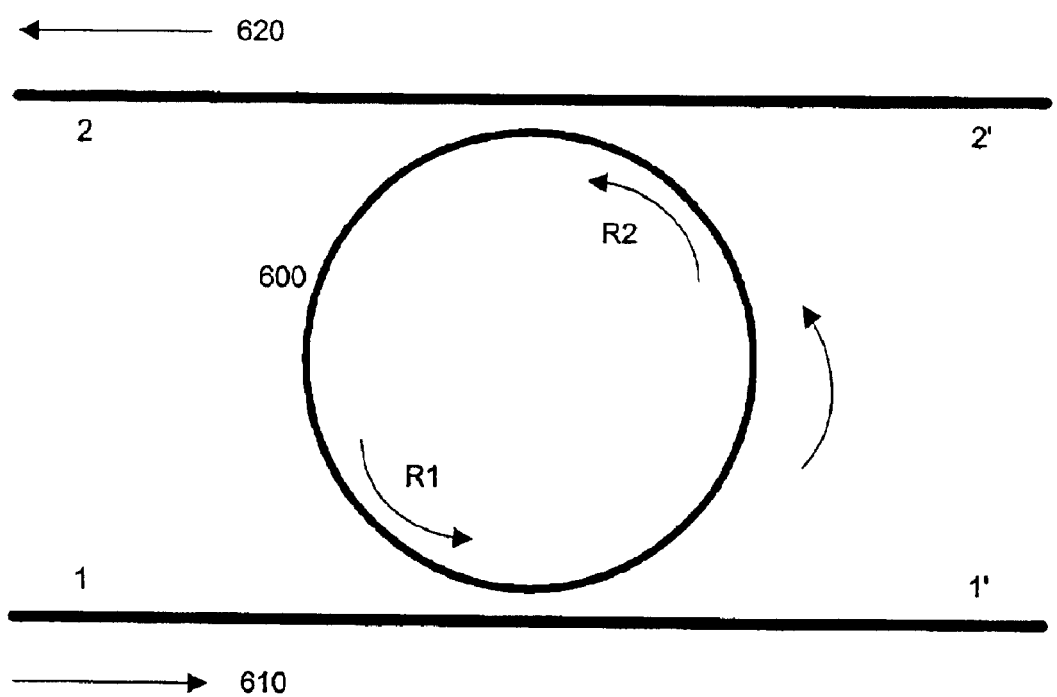
FIG. 6 is a schematic of a ring resonator according to one embodiment of the present invention.

FIG. 6 illustrates a schematic showing the ring resonator, where 600 is the waveguide ring, 610 is the straight input waveguide section, and 620 is the straight output waveguide section. The input and output waveguide sections run in close proximity to the ring. The operation of the ring resonator is similar to a regular Fabry-Perot etalon as described by D. Rafizadeh, et. al. in their paper entitled "Propagation Loss Measurements in Semiconductor Microcavity Ring and Disk Resonators", Journal of Ligthwave Technology 16 (7), pages 1308 through 1314 (1998), and incorporated herein as reference.

A waveguide with a $SiO_2$ upper cladding thickness of 3 $\mu$m and n=1.463, a SiON core of thickness 3×3 $\mu$m and n=1.483, and a $SiO_2$ lower cladding thickness of 10 $\mu$m and n=1.463 has been fabricated and tested using the technique described by Kerstin Worhoff, et. al. in their paper entitled "Design, Tolerance Analysis, and Fabrication of Silicon Oxynitride Based Planar Optical Waveguides for Communication Devices", Journal of Lightwave Technology 17, (8), pages 1401 through 1407 (1999), and incorporated herein as reference. The tested waveguide had slab propagation losses of 0.2 dB/cm at 1.55 $\mu$m and losses due to the curvature of 0.12 dB per ring at 0.17 mm curvature radius.

The coupling between the ring and straight waveguide sections is accomplished through evanescent wave interaction. This interaction and the coupled mode theory accompanying it are described in further detail in the book entitled "Physics of Optoelectronic Devices" by S. L. Chuang, John Wiley and Sons (New York, 1995), and incorporated herein as reference. This coupling can be further described by effective mirror reflectivities in the paper by D. Rafizadeh (see reference above).

The transmissivity T from port 1 to port 2 in FIG. 2 can be expressed as:

$$T=A(1-R_1)(1-R_2)/[(1-\sqrt{R_1R_2}A)^2+4\sqrt{R_1R_2}A\sin^2(\delta/2)] \rightarrow \text{Equation 1}$$

Here $R_1$ and $R_2$ are the effective mirror reflectivities, $\delta$ is the round trip phase increment, and A is the total round trip loss combining propagation waveguide bending losses. The above equation describes a series (or comb) of resonances whose finesse depends on $R_1$, $R_2$, and A.

Semiconductor Laser Line Narrowing

The linewidth of the semiconductor laser is greatly reduced by coupling the ring resonator to an external optical feedback with a sharp reflectance resonance. The method used to reduce the linewidth is described in further detail by Rudolf F. Kazarinov and Charles H. Henry in their paper entitled "The Relation of Line Narrowing and Chirp Reduction Resulting from the Coupling of a Semiconductor Laser to a Passive Resonator", IEEE Journal of Quantum Electronics, QE-23 (9), pages 1401 through 1409 (1987), and incorporated herein as reference.

Figure 7:
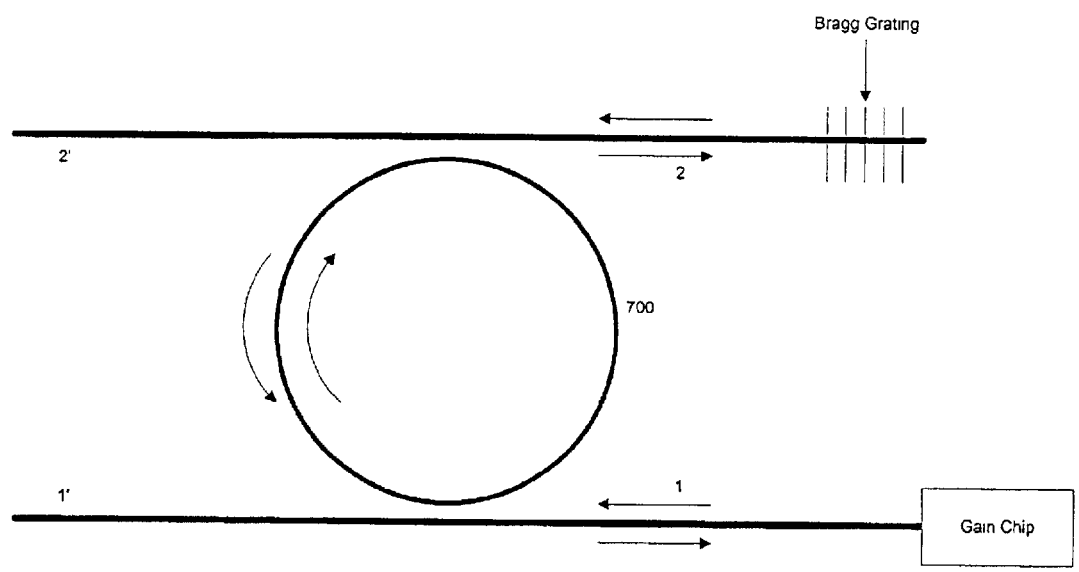
FIG. 7 is a schematic of a Bragg grating combined with a ring resonator according to one embodiment of the present invention.

The present invention describes the use of a ring resonator in combination with a Bragg grating, which is depicted in FIG. 7. Ring resonator 700 is placed in close proximity to straight input waveguide section marked 1 that originates from a gain chip, and straight output waveguide section marked 2 that is the external feedback element with the Bragg gratings. One purpose of the Bragg grating is to select a single ring resonance out of the comb described by Equation 1 above to insure a stable single mode operation of the semiconductor laser.

Figure 8:
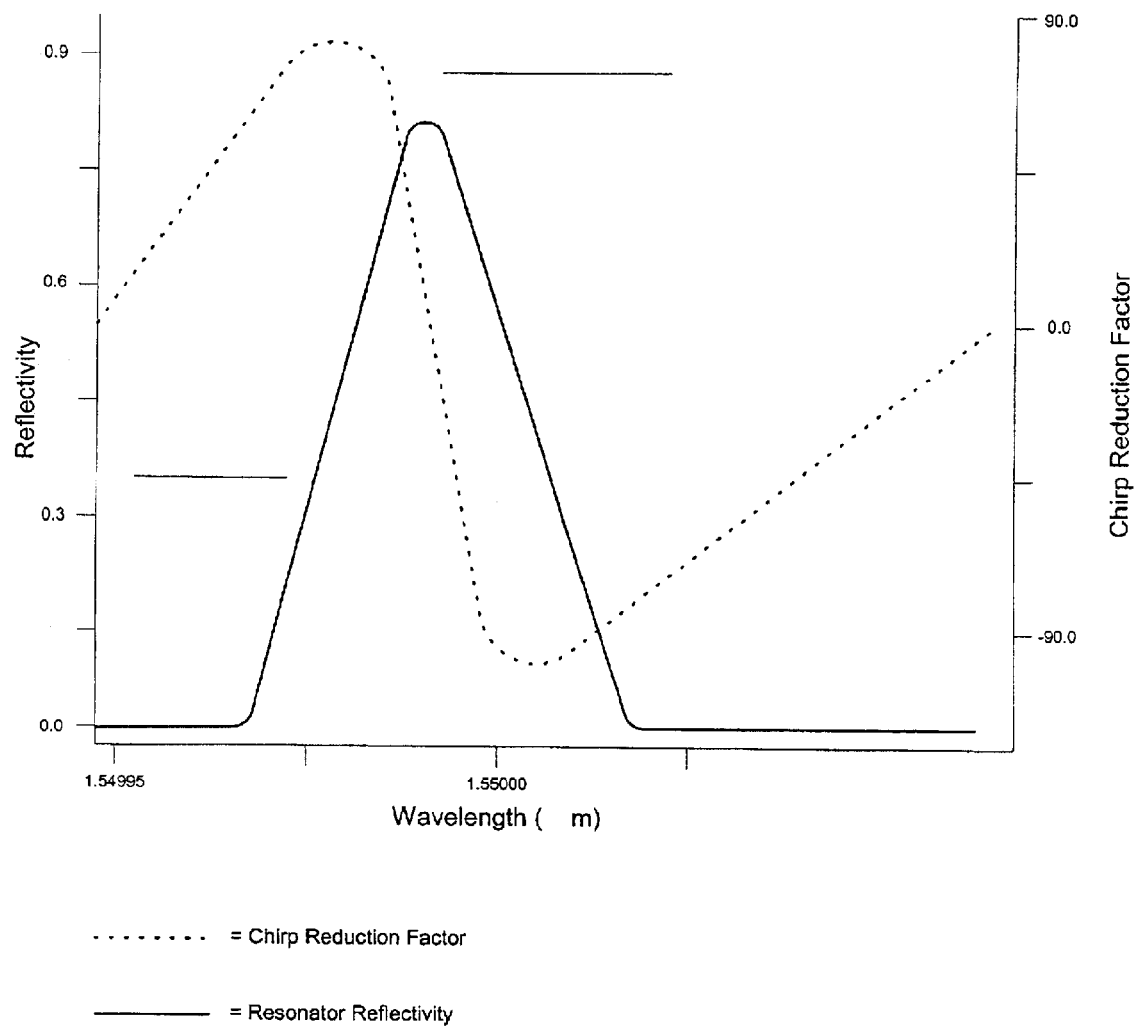
FIG. 8 illustrates a graph of the calculated reflectivity using a combination of a ring resonator and a Bragg grating according to one embodiment of the present invention.

FIG. 8 illustrates a graph of the calculated reflectivity of a ring resonator in combination with a Bragg grating as described above, assuming propagation losses of 0.2 dB/cm, and a ring radius of 0.3 cm. Using these assumptions, the device has a Q=1×10⁵. Assumptions are also made that the Bragg grating has a reflectivity of 0.97 at and around one of the ring resonances, and that its reflectance peak is narrower than twice the free spectral range (FSR) of the ring. The FSR of this resonator taking the above mentioned assumptions is approximately 0.1 nm that have been further lowered to 0.08 nm under laboratory conditions.

Another purpose of the Bragg grating is to match the reflection band of the grating with one of the resonator peaks. One possible solution to accomplish this is to deposit a heater element on top of the ring resonator cladding as described by Paivi Heimala, et. al. in their paper entitled "Thermally Tunable Integrated Optical Ring Resonator with Poly-Si Thermistor", Journal of Lightwave Technology 17 (10), pages 2260 through 2267 (1996), and incorporated herein as reference. Heating the ring (or the grating) section as described by the above paper facilitates independent sweeps of a resonator peak relative to the grating reflection band. Using this method the line narrowing is proportional to $F^2$, where F is the chirp reduction factor as described by R. Kazarinov (see reference above).

Line narrowing depends on the sharpness of the reflectivity peak as well as waveguide losses, reflectivity at the interface between the semiconductor die and the external feedback element, and mode mismatch losses. Using the mathematical treatment developed by R. Kazarinov (see reference above), and given a waveguide loss of 0.2 dB/cm, a mode mismatch loss of 1 dB and an interface reflectivity of 3% (0.13 dB), the ring resonator external feedback may provide a linewidth reduction factor $F^2$ of up to 8000. This is more than enough to convert a gain chip with 50 MHz linewidth into a laser with a 10 KHz linewidth. This is comparable to the Nd:YAG lasers currently being used in the field of metrology.

Thus, a method and apparatus for creating a narrow linewidth hybrid semiconductor laser is described in conjunction with one or more specific embodiments. The invention is defined by the following claims and their full scope of equivalents.

I claim:

1. A method for creating a narrow linewidth hybrid semiconductor laser comprising:

coupling a semiconductor gain chip to a single external feedback element, said external feedback element comprising a ring resonator and a Bragg grating in a single element.

2. The method of claim 1 wherein said external feedback element is coupled to a waveguide.

3. The method of claim 2 wherein said waveguide is made of silicon-oxide and silicon-oxinitride.

4. The method of claim 1 wherein said ring resonator is based on plasma enhanced chemical vapor deposition silicon-oxide/silicon-oxinitride waveguide technology.

5. The method of claim 1 wherein said ring resonator further comprises a waveguide ring and two straight waveguide sections.

6. The method of claim 5 wherein said waveguide ring and said two straight wave guide sections are coupled through evanescent wave interaction.

7. A narrow linewidth hybrid semiconductor laser apparatus comprising:

semiconductor gain chip coupled to a single external feedback element, said external feedback element comprising a ring resonator and a Bragg grating in a single element.

8. The apparatus of claim 7 wherein said external feedback element is coupled to a waveguide.

9. The apparatus of claim 8 wherein said waveguide is made of silicon-oxide and silicon-oxinitride.

10. The apparatus of claim 7 wherein said ring resonator is based on plasma enhanced chemical vapor deposition silicon-oxide/silicon-oxinitride waveguide.

11. The apparatus of claim 7 wherein said ring resonator further comprises a waveguide ring and two straight waveguide sections.

12. The apparatus of claim 11 wherein said waveguide ring and said two straight waveguide sections are coupled through evanescent wave interaction.

13. A method for creating a narrow linewidth hybrid semiconductor laser comprising:

coupling a semiconductor gain chip to a single external feedback element, said external feedback element comprising a ring resonator and a Bragg grating; and coupling said external feedback element to a waveguide, wherein said waveguide is made of silicon-oxide and silicon-oxinitride.

14. A narrow linewidth hybrid semiconductor laser apparatus comprising:

semiconductor gain chip coupled to a single external feedback element, said external feedback element comprising a ring resonator and a Bragg grating; and coupling said external feedback element to a waveguide, wherein said waveguide is made of silicon-oxide and silicon-oxinitride.

* * * * *

UNITED STATES PATENT AND TRADEMARK OFFICE
CERTIFICATE OF CORRECTION

PATENT NO. : 6,856,641 B2
DATED : February 15, 2005
INVENTOR(S) : Ksendzov

It is certified that error appears in the above-identified patent and that said Letters Patent is hereby corrected as shown below:

Column 1,
Line 24, remove ";".

Column 2,
Line 42, replace "spare" with -- space --.

Column 3,
Line 33, remove the second occurrence of ".".

Column 5,
Line 38, replace the word "lin-" with -- line- --.
Line 39, replace the word "ewidth" with -- -width --.

Signed and Sealed this

Sixth Day of September, 2005

JON W. DUDAS
*Director of the United States Patent and Trademark Office*